United States Patent [19] [11] Patent Number: 4,890,095
Esser et al. [45] Date of Patent: Dec. 26, 1989

[54] CIRCUIT ARRANGEMENT FOR AUTOMATICALLY MONITORING SEVERAL ANALOG ELECTRIC SIGNALS

[75] Inventors: Wolfgang Esser; Peter Jung, both of Paderborn, Fed. Rep. of Germany

[73] Assignee: Nixdorf Computer AG, Fed. Rep. of Germany

[21] Appl. No.: 933,740

[22] Filed: Nov. 21, 1986

[30] Foreign Application Priority Data

Nov. 22, 1985 [DE] Fed. Rep. of Germany ....... 3541343

[51] Int. Cl.⁴ .............................................. G08B 21/00
[52] U.S. Cl. ................................ 340/657; 340/870.13; 340/870.16; 341/141
[58] Field of Search .............. 340/657, 870.13, 870.14, 340/870.16; 341/108, 141; 370/77; 307/231, 510, 525

[56] References Cited

U.S. PATENT DOCUMENTS 4,454,500  6/1984  Kato et al. .................... 340/347 AD Primary Examiner—Donald J. Yusko
Assistant Examiner—Tyrone Queen
Attorney, Agent, or Firm—Varnum, Riddering, Schmidt & Howlett

[57] ABSTRACT

A circuit arrangement is described for automatically monitoring several analog electric signals and for maintaining predetermined ranges of tolerances by successive comparison with reference values. Error alarm signals are produced and stored, dependent upon the comparison and timed (synchronized) simultaneously with the connection of the respective signals to be monitored to a comparator (20). Access is provided to a reference value storage (30) from which reference signals assigned to each single signal and ranges of tolerances defining reference values are timed and led to the comparator (20). The respective outlet (output) signal of the comparator (20) for producing similar error alarm signals to be stored is logically linked with an evaluating signals (ZB 0) indicating which of the two reference values lies at any time on the comparator (20).

11 Claims, 2 Drawing Sheets

CIRCUIT ARRANGEMENT FOR AUTOMATICALLY MONITORING SEVERAL ANALOG ELECTRIC SIGNALS

TECHNICAL FIELD

The invention relates to a circuit arrangement for automatically monitoring several, analog electric signals for observing predetermined ranges of tolerances by successive comparison with reference values and production and storage of error alarm signals dependent on comparison. A circuit arrangement of this type is known from the U.S. Pat. No. 4,454,500.

BACKGROUND ART

It is often necessary to monitor several electric signals relative to the maintenance (observance) of predetermined ranges of tolerances in cases of monitoring electric equipment such as, for example, communication or data processing equipment. It is true that the above-mentioned known circuit arrangements could be applied for this purpose. Nevertheless, relative and circumstantial functional steps would have to be programmed resulting in a complicated structure of the circuit. In the course of the successive comparison of an analog electric signal with the reference values, it is necessary to feed into a data register a reference value for each comparison process and to query a blocking register topped by a comparator. The results of the query (inquiry) of the blocking registers must be evaluated in a microprocessor only after the above steps. Erroneous monitoring results can occur during the relatively long period of time between when the analog signal changes and the queries of the blocking registers when the evaluating microprocessor is interrupted by other programs.

Especially for the above-mentioned purpose of application, it should be possible to execute automatically the monitoring of several analog signals in a cyclical sequence and to have the monitoring results available after each respective cycle. Even this is not easily realizable with the known circuit arrangement.

SUMMARY OF THE INVENTION

It is the task of the invention to indicate a circuit arrangement that complies with these requirements and eliminates monitoring errors of the known circuit arrangement.

This task is solved for the circuit arrangement of the initially mentioned type according to the invention so that an access is realized to a reference value storage, timed simultaneously with the connection of the respective signals to be monitored to a comparator. Reference values in the storage are assigned to each signal and define a range of tolerance. The reference values are read one after another and fed to the comparator. The respective output (outlet) signal of the comparator is logically linked for producing error alarm signals to be stored with an evaluating signal that indicates which of the two reference values lies at any time on the comparator.

Thus, the invention foresees that in a certain chronological assignment, mutually timed, the successive attachment of the respective signal to be monitored is coordinated with the connection of the previously stored reference values, and that similar error alarm signals are stored in a certain produced logic linkage. Altogether, this makes possible a cylcical automatic query of several monitoring points in one electric device so that the monitoring results can be obtained after a respective cycle, to a certain extent, as a bundle of signals from one storage. The application of a reference value storage makes it possible to base new reference values for each analog signal to each similar monitoring cycle.

When an input signal exceeds the reference value, the digital output signal of a comparator has, for example, the status L. Consequently, when the input signal is less than the reference value, the digital output signal of the comparator has the status H. An overstepping of the larger reference value and an understepping of the smaller reference value can be recognized when using a single comparator in the respective comparison only on a certain error alarm signal status, i.e. either only on the status L or only on the status H. Therefore, the invention foresees the production of an error alarm signal of a certain status so that the output signal of the comparator is logically linked with a monitoring signal identifying the reference value effective at that time so that an overstepping or an understepping of a reference value is signaled similarly, i.e., as a deviation from the predetermined tolerance range.

In a preferred further development of the invention, a multiplexer is foreseen for successively feeding the analog electric signals into the comparator. The circuit lines conducting the signals to be monitored can be simply connected with the comparator, one after another, by a suitable multiplexer addressing.

In a further development of the invention, the comparator is connected for activation by the reference values over a digital/analog converter with the reference value storage containing digitally the reference values. By digitally storing the reference values and by feeding them into the comparator by a digital/analog converter, a high grade of precision of the reference values is secured on the comparator.

According to a further development of the invention, when the reference value storage can be freely programmed, the reference values contained digitally in the reference value storage can be changed in any desired manner.

In a further development of the invention, the reference value storage for each signal to be monitored contains under an even numbered address the small or the large reference value and under the next higher uneven numbered address the large or the small reference value, respectively. The reference value storage will be addressed, in case of successively increased series of addresses, at a double frequency in comparison with the multiplexer. Thereby, it is secured in a simple manner that the reference values are fed into a comparator with each signal to be monitored.

This is realized in a simple manner according to a further development of the invention by a circuit arrangement for monitoring maximal $2^N$ analog electric signals so that the reference value storage is addressed by the signals of the counter-bits 0 to N and the multiplexer by the signals of the counter-bits 1 to N of a binary counter. Since the counter bit 0 of the lowermost value of the binary counter is not fed into the multiplexer, the address of the multiplexer is increased only by 1 at each second counting step of the binary counter. However, since the address of the reference value storage is increased by 1 at each counting step of the binary counter, under each address of the multiplexer, i.e., at each signal fed into the comparator, two storage cells of the reference value storage are read, the contents of which are fed into the comparator by the digital/analog converter. When the one storage cells contains, at any time, a small reference value and the other storage cell contains a large reference value, each analog electric signal to be monitored in the comparator is compared with two reference values limiting a predetermined range of tolerances.

By applying this type of addressing of the multiplexer and the reference value storage, the evaluating signal that indicates which of the two reference values lies, at any time, on the comparator is formed advantageously by the counter-bit 0 of the binary counter. In case that the reference value storage contains, for example, the small reference value for each signal to be monitored under an even numbered address and under the next higher uneven address the large reference value, the counter bit 0 of the binary counter is then in status L just when a small reference value from the reference value storage is read, and in status H just when a large reference value is read from the reference value storage.

In a preferred further developmnt of the invention, the logic linkage of the actual output signal of the comparator is made with a signal of the counter bit 0 of the binary counter by an EXCLUSIVE-OR member. When again the small reference value is stored in the reference value storage for each signal to be monitored under an even numbered address and the large reference valve is stored under the next higher, uneven numbered address, and when the output signal of the comparator takes the status L (in case that a monitored signal is larger than a reference value) or takes the status H (in case that a monitored signal is smaller than a reference value), a uniform error alarm signal is obtained by the EXCLUSIVE-OR logic linkage of the respective comparator output signal with the signal of the counter bit 0 of the binary counter that addresses the reference value storage. A uniform error alarm signal signals at status H either an understepping of the small reference value or an overstepping of the large reference value, i.e., a deviation from the predetermined range of tolerances.

In a further development of the invention, the multiplexer and the comparator are interconnected by a hold member that is controllable relative to the reception of the respective multiplexer output signal. The control input of the hold member is connected to the output of an AND member that links logically the inverted signal of the counter bit 0 of the binary counter with a timing signal incrementing the former signal. The hold signal serves here for a defined reception and a temporary storage of the respective output signal of the multiplexer.

In a preferred further development of the invention, the error alarm signals occurring in a monitoring cycle are stored at the time in a shifting register until the next monitoring cycle starts. This results in the advantage that the content of the shifting register can be evaluated at the end of a monitoring cycle. It can thus be determined in which analog electric signal an overstepping or understepping of a limit (boundary) value has occurred.

In order to have this evaluation made automatically by electronic data processing equipment, a control unit is provided in a further advantageous development of the invention, which controls the programming of the reference value storage between two monitoring cycles and the defined starting and stopping of the monitoring cycles.

BRIEF DESCRIPTION OF THE DRAWINGS

The invention is further explained on the basis of an example embodiment in connection with the following figures, in which.

DETAILED DESCRIPTION

Figure 1:
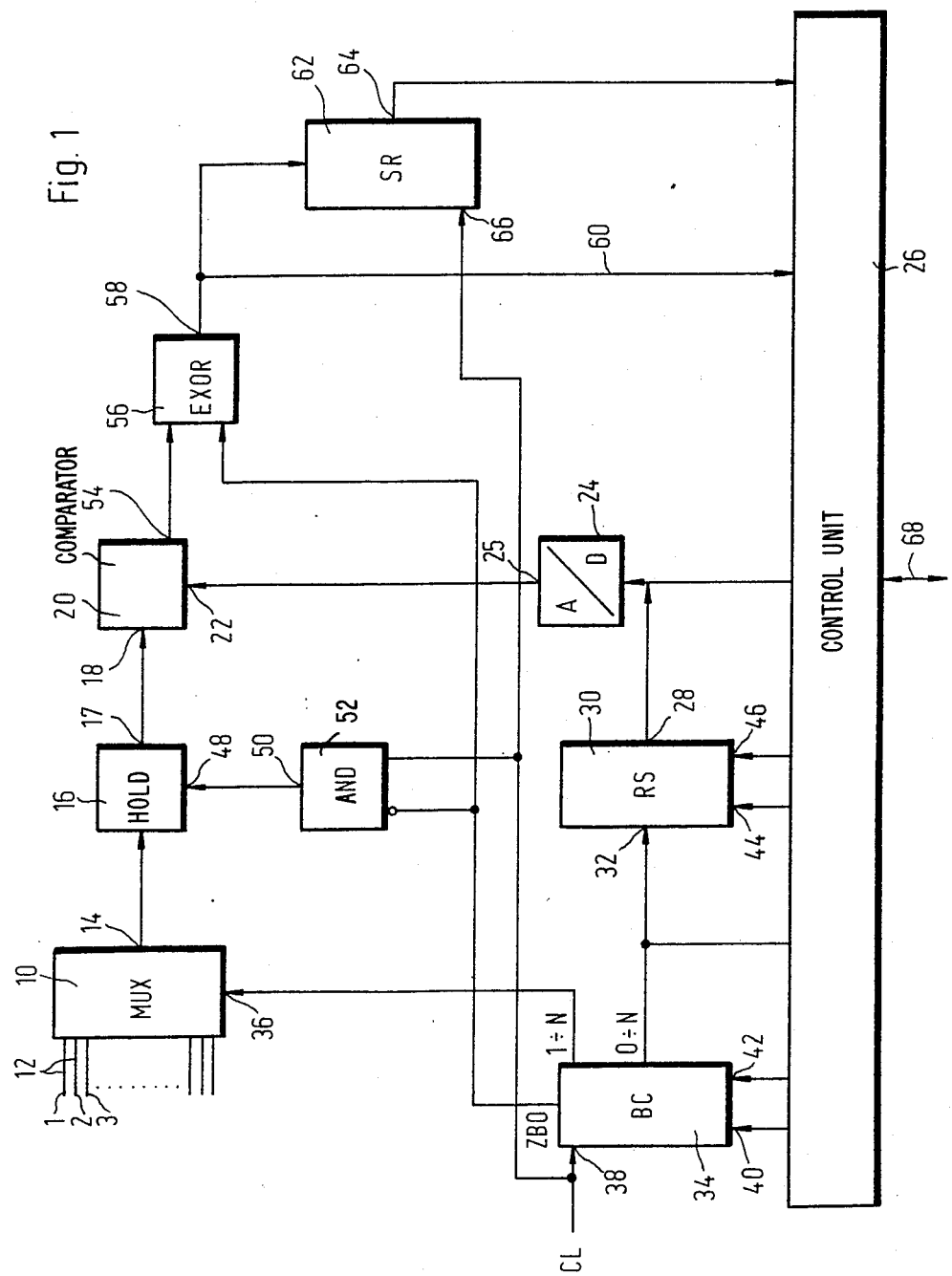
FIG. 1 is an example embodiment of a circuit arrangement in accordance with the invention.

FIG. 1 shows a circuit arrangement for intermittent automatic monitoring of several analog electric signals relative to maintaining the predetermined ranges of tolerances. It contains a multiplexer 10 on the inlets 12 of which lie the analog electric signals to be monitored. The output 14 of the multiplexer 10 is connected by a hold member 16, controllable relative to the reception of the respective multiplexer output signal by the measuring input 18 of a comparator 20. The reference input 22 of the comparator 20 is connected to the analog output 25 of a digital/analog converter 24, the digital input of which is connected, on the one hand, with a control unit 26 and, on the other hand, with the data output 28 of a write/read storage 30, serving as a reference value storage. The address inputs 32 of this reference value storage 30 are connected to the control unit 26 for the purpose of storage of reference values. Furthermore, they are connected with all counter bits 0 to N of a binary counter 34. The counter bits 1 to N of counter 34 are equally connected to the address iputs 36 of the multiplexer 10.

The binary counter 34 is controlled at its timing input 38 by a timing signal CL. Its counter direction inlet 40 and its counter presetting inlet 42 are connected further with the control unit 26. The reference value storage 30 is also connected for storing the reference values with its data inlet 44 and with its writing inlet 46 to the control unit 26.

The hold member 16 is connected at its control input (inlet) 48 with the outlet 50 of an AND member 52 having an inverting input that links the inverted signals of signals ZB 0 corresponding to the counter bit 0 of the binary counter 34 with the synchronizing signal CL. By this logic linkage, it is effected that the respective multiplexer output signal is taken over into the hold member 16 and placed from its outlet 17 to the measuring inlet 18 of the comparator 20 only in case of an even numbered counter status of the binary counter 34, i.e., when the address of the multiplexer 10 has been counted higher just by 1.

The outlet 54 of the comparator 20 is connected with an inlet of an EXCLUSIVE-OR member 56 that links the output signal of the comparator 20 with the signal ZB 0 of the counter bit 0 of the binary counter 34. At the output 58 of this EXCLUSIVE-OR member 56 appear then the eventual error alarm signals indicating similarly an overstepping and an understepping of the reference value by a signal to be monitored.

The error alarm signals occurring in a monitoring cycle are led directly, on the one hand, over a connecting line 60 to the control unit 26 and, on the other hand, stored temporarily until the start of the next monitoring cycle into a shifting register 62. At the start of the next cycle, the alarm signals are led over the outlet 64 of the shifting register 62 into the control unit 26. The shifting register 62 is controlled, just as the binary counter 34, over its timing input 66 by the timing signal CL.

The control unit 26 is connected, for the purposes of presetting the binary counter, storing of the reference values in the reference value storage 30, and evaluation of the temporarily stored error alarm signals in the shifting register 62, through connections 68 with an electronic data processing device (not shown).

Figure 2:
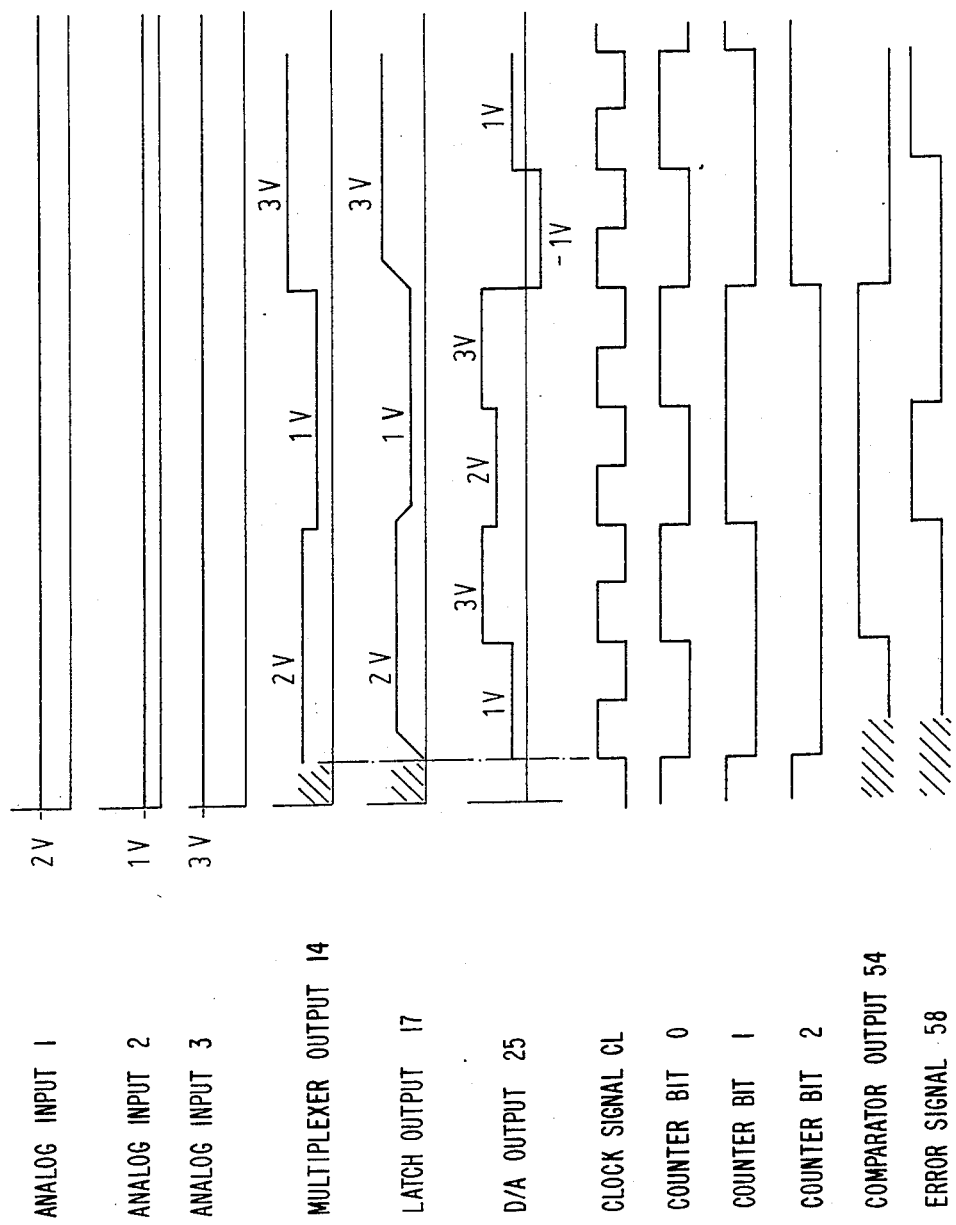
FIG. 2 shows the course of signals on several points of the circuit arrangement of FIG. 1.

After having described above the design of the circuit arrangement illustrated in FIG. 1 for intermittent automatic monitoring of several analog electric signals, the function of this circuit arrangement will be nearer explained in the following, based on FIG. 1 in connection with FIG. 2.

The analog electric signals to be monitored are led, for example, to the $2^N$ inputs (inlets) 12 of the multiplexer 10. As already mentioned above, the address inputs 36 of the multiplexer 10 are actuated by the counter bits 1 to N of the binary counter 34. In comparison to this, the reference value storage 30 is addressed with the counter bits 0 to N of the binary counter 34. The reference value storage 30 contains the low reference value for each signal to be monitored under an even numbered address (including the address 0) and under the next, higher uneven numbered address, the large reference value. These reference values have been stored during an initializing phase, under control of the control unit 26, by electronic data processing equipment, not illustrated in FIG. 1. Before the first monitoring cycle can start, the binary counter 34 will be preset to the counter status $2^{N+1}-1$, being equally under control of the control unit 26. Since the signals of all counter bits of the binary counter 34 are then in status H, the signals of all counter bits 0 to N take on the status L when the first, positive synchronized signal occurs under a started monitoring cycle. The multiplexer 10, as well as the reference value storage 30 are then addressed by this address that has on all address positions the status L. At this address, the analog inlet 1 of the multiplexer 10 is connected with its outlet 14 so that the first monitoring signal is led to the hold member 16. With the synchronizing signal CL at status H, the control inlet 48 of the hold member 16 is actuated by the AND member 52 by means of a signal in the status H so that the signal lying on the hold member 16 is taken over into it and is thereby led to the measuring inlet 18 of the comparator 20.

The small digitally stored reference value stored under the address 0 in the reference value storage 30 for the first signal to be monitored is simultaneously read and led through the digital/analog converter 24 to the reference inlet 22 of the comparator 20. Since the first signal to be monitored has a voltage of 2 V and thus oversteps the reference value stored under the address 0 in the reference value storage 30, the comparator outlet signal maintains its status L. This comparator outlet signal is logically linked with the signal ZB 0 of the counter bit 0 in the EXCLUSIVE-OR member 56. Since signal ZB 0 of the counter bit 0 has the status L, the signal appearing at the outlet 58 of the EXCLUSIVE-OR member 56 takes on the status L in agreement with the outlet signal of the comparator 20.

By the followig positive step of the timing signal CL, the then current status of the outlet signal of the EXCLUSIVE-OR member 56 is taken over into the shifting register 62. The binary counter 34 is simultaneously incremented by means of this positive step of the timing signal CL by 1 so that the signal ZB 0 of the counter bit 0 has now the status H. Since the counter bit 0 is not connected to the multiplexer 10, the first signal to be monitored remains further maintained on the outlet 14 of the multiplexer 10. The hold member 16 is locked, since the outlet signal of the AND member 52, adjacent to the control inlet 48 of member 16, takes on the status L with a signal of the counter bit 0 having a status H. However, since the signal of the counter bit 0 is used for addressing the reference value storage 30, the large reference value of 3 V that is stored under the address 1 for the first signal to be monitored is read and is led through the digital/analog converter 24 to the reference inlet 22 of the comparator 20. Since this reference value is larger than the first signal of 2 V to be monitored, the comparator outlet signal takes the status H. By the logic linking this comparator outlet signal with the signal of the counter bit 0 of a status H in the EXCLUSIVE-OR member 56, a signal of the status L results on its outlet 58. This harmonizes with FIG. 2 which shows that the first signal to be monitored lying on the analog inlet 1 of the multiplexer 10 is larger than the previously provided small reference value of 1 V and smaller than the large reference value of 3 V.

The momentary status of the outlet signal of the EXCLUSIVE-OR member 56 is taken over again into the shifting register 62 with the next positive step of the synchronized signal CL. Further, the binary counter 34 is counter again higher by 1 to the counter value 2 (signal of the counter bit 1 = H and the signal of the counter bit 0 = L). The analog inlet 2 of the multiplexer 10 is connected with this address to its outlet 14 so that the second signal of 1 V to be monitored is led to the measuring inlet 18 of the comparator 20. The small reference value of 2 V is simultaneously led to the reference inlet 22 of the comparator 20. However, since the small reference value is larger than the second signal to be monitored, the signal at the outlet 58 of the EXCLUSIVE-OR member 56 takes on the status H, i.e., the error alarm signal is present.

By renewed incrementing of the binary counter 34, the large reference value of 3 V, stored for the second signal to be monitored under the address 3 in the reference value storage 30, is led to the comparator 20. Since this reference value is larger than the second signal to be monitored, the outlet signal of the EXCLUSIVE-OR member 56 has again the status L; thus, no error alarm signal results.

A renewed incrementing of the binary counter 34 causes the small reference value of $-1$ V, stored under the address 4 for the third signal of 3 V in the reference value storage 30, to be led to the comparator 20. The analog inlet 3 of the multiplexer 10 is connected further with the outlet 14 of the multiplexer 10. Since the signal of 3 V to be monitored does not lie below the small reference value $-1$ V, no error alarm signal occurs on the outlet 58 of the EXCLUSIVE-OR member 56. This is made possible only by a further incrementing of the binary counter 34, when the large reference value of 1 V, stored under the address 5, is led to the comparator 20. Since the signal of 3 V lies then above the large reference valve of 1 V, an error alarm signal is formed. These measuring steps are also seen in the illustration drawn in FIG. 2.

By successive incrementing of the binary counter 34 to the counter status $2^{N+1}-1$, all $2^N$ electric analog signals are always compared with a small and a large reference value which are foreseen for them. They are thus automatically checked out relative to the maintenance of predetermined ranges of tolerances.

After the end of a monitoring cycle for several signals, the error alarm signals, occurring in the just finished monitoring cycle and stored in the shifting register 62, can be evaluated in an electronic data processing installation before starting the next monitoring cycle.

Should a mismeasuring take place during a monitoring cycle and be recognized as such by the control unit 26 or recognized as such by the data processing installation connected to the control unit 26, it is then possible to repeat immediately this measuring by having the control unit 26, directing correspondingly the binary counter 34 over the inlet of the counting direction 40. It is also possible to skip the analog inlet 12 of the multiplexer 10 that has eventually not been used during a monitoring cycle so that the number of the measuring points over the numbers presetting inlet 42 of the binary counter 34 are preset in a way that the addresses of the not used analog inlets 12 are skipped.

It will be apparent to those skilled in the pertinent art that modifications and variations of the above-described illustrative embodiment of the invention can be effected without departing from the spirit and scope of the novel concepts of the invention.

The embodiments of the invention in which an exclusive property or privilege is claimed are defined as follows:

1. A method for use in a circuit arrangement for automatically monitoring several, analog electric signals to maintain predetermined ranges of tolerances, comprising the steps of successive comparison of the analog electric signals with reference values, and generating and storing error alarm signals representative of the results of the successive comparisons, characterized in that the method further comprises the steps of:
   assigning a range of tolerances to each of the analog electric signals, the range of tolerances defining the reference values;
   accessing a reference value storage (30) in a sequence which is timed with the comparison of the analog electric signals by connecting the analog electric signals to be monitored to a comparator (20);
   reading the range of tolerances defining the reference values from the reference value storage (30) and applying the reference values one after another to the comparator (20) in a timed relationship with the connection of the analog electric signals to the comparator (20);
   generating from the comparator (20) a respective outlet signal representative of the comparison of the reference values with the analog electric signals; and
   logically linking the respective outlet signal with an evaluating signal (ZB 0) so as to produce similar error alarm signals to be stored, the evaluating signal indicative of which one of a pair of the reference values is then applied to the comparator (20).

2. A method according to claim 1, characterized in that the circuit arrangement comprises a multiplexer (10) for successively admitting the analog electric signals to the comparator (20).

3. A method according to claim 2, characterized in that the comparator (20), for actuation by reference values over a digital/analog converter (24), is connected with the reference value storage (30) containing the reference values in digital format.

4. A method according to claim 3, characterized in that the reference value storage (30) is programmable.

5. A method according to claim 3, characterized in that the reference value storage (30), for each signal to be monitored, contains under an even numbered address a small or a large reference value, and under the next higher uneven numbered address contains the large or the small reference value, respectively, and that the reference value storage (30) is addressed at double frequency relative to a frequency of addressing the multiplexer (10) in case of a successively increasing sequence of addresses.

6. A method according to claim 5 for monitoring at most $2^N$ analog electric signals, characterized in that the refernce value storage (30) is addressed by signals of the counter bits 0 to N and the multiplexer (10) with signals of the counter bits 1 to N of a binary counter (34).

7. A method according to claim 6, characterized in that the evaluating signal (ZB 0) is formed by the signal of the counter bit 0 of the binary counter (34).

8. A method according to claim 7, characterized in that logic linkage of the respective output signal of the comparator (20) with the signal of the counter bit 0 of the binary counter (34) is provided by means of an EXCLUSIVE-OR member (56).

9. A method according to claim 6, characterized in that the multiplexer (10) and the comparator (20) are interconnected by a hold member (16) that is controllable for applying multiplexer outlet signals to the comparator (20), and has its control inlet (48) connected to the outlet (50) of an AND member (52) that links the inverted signal of the counter bit 0 of the binary counter (34) with an incrementing timing signal (CL).

10. A method according to claim 1, characterized in that the error alarm signals occurring in one monitoring cycle are stored in a shifting register (62) always until the start of a next monitoring cycle.

11. A method according to claim 10, characterized in that the circuit arrangement comprises a control unit (26) for controlling programming of the reference value storage (30) between two monitoring cycles, defined starting and stopping of the monitoring cycles, and the evaluation of the error alarm signals stored in the shifting register (62) by means of an electronic data processing installation.

* * * * *